United States Patent
Arlt et al.

(10) Patent No.: US 7,336,015 B2
(45) Date of Patent: Feb. 26, 2008

(54) METHOD OF MANIPULATING WAFERS

(75) Inventors: Joachim Arlt, Netphen (DE);
Karl-Hermann Busse, Wilnsdorf (DE)

(73) Assignee: VanTec Gesellschaft für Venturekapital und Unternehmensberatung, Siegen (DE)

( * ) Notice: Subject to any disclaimer, the term of this patent is extended or adjusted under 35 U.S.C. 154(b) by 370 days.

(21) Appl. No.: 10/026,917

(22) Filed: Dec. 21, 2001

(65) Prior Publication Data

US 2002/0110449 A1    Aug. 15, 2002

(51) Int. Cl.
*H02N 1/00* (2006.01)
(52) U.S. Cl. .................. 310/309; 414/808; 414/935
(58) Field of Classification Search ............. 310/309; 414/808, 935
See application file for complete search history.

(56) References Cited

U.S. PATENT DOCUMENTS 5,815,366 A * 9/1998 Morita et al. ............. 361/234
5,948,986 A * 9/1999 Brown ........................ 73/630
6,238,160 B1 * 5/2001 Hwang et al. .............. 414/217
6,354,791 B1 * 3/2002 Wytman et al. ......... 414/744.3
6,444,033 B1 * 9/2002 O'Mara et al. ............. 118/621

FOREIGN PATENT DOCUMENTS

EP        0701319 A1 * 3/1996
JP        58-104806     * 6/1983

* cited by examiner

*Primary Examiner*—Thomas M. Dougherty
(74) *Attorney, Agent, or Firm*—Friedrich Kueffner

(57) ABSTRACT

A method of manipulating preferable thin wafers, preferably having a thickness of less than 200 µm, wherein the wafers are placed prior to polishing or another processing step for reducing the thickness thereof on a transportable electrostatic carrier. The wafers remain on the transportable electrostatic carrier for the duration of and between at least two processing steps, during the manipulating steps and during any necessary intermediate storage.

16 Claims, No Drawings

METHOD OF MANIPULATING WAFERS

BACKGROUND OF THE INVENTION

1. Field of the Invention

The present invention relates to a method of manipulating semiconductor substrates or wafers.

2. Description of the Related Art

Electrostatic carrier systems have long been known in the art and are described in several patents. The prior art is outlined in the following overview articles which refer to the patent literature: Shermann et al.: Semiconductor International V Jul. 20, 1997, 319-321; Olsen et al.: Rev Sci. Instrum. 66 (2) February 1995, 1108-14; Watanabe et al.: Jpn. J. Appl. Phys. Vol (32) 1993, 864-71; Hartsough Solid State Technol., 97 (1) 1994, 91-98.

Consequently, it is known in the art to fix semiconductor substrates or wafers by means of electrostatic carrier devices in machines for treating wafers. However, the wafers are separated from the electrostatic carrier system after the end of each process step.

The transfer of wafers using electrostatic carrier systems from and to any type of substrate carrier has also already been described, for example, by Shermann et al. However, all these devices have in common that the wafer remains connected to the electrostatic carrier system only during a process or manipulating step within a processing machine.

Systems of this type meet all the requirements which are made of them, at least as far as the manipulation is concerned in wafers having standard thicknesses of about 200 μm up to thin wafers of about 100 μm. In the case of thicknesses of about 200 μm to about 100 μm, the requirements are only met if the wafer is additionally reinforced with a plastic film or tape attached or glued to it. Another difficulty is the fact that thin polished wavers are extremely sensitive to breakage, as long as defects caused by polishing are not removed by wet or dry stress relief etching.

In the case of wafers of having a thickness of below about 100 μm (the technical limit is presently at 20 μm), the prior art teaches that the wafers have been applied onto a rigid carrier by gluing (using wax, a double-sided plastic film or tape, pure adhesive) or even by soldering, in order to reduce the danger of breakage and the significant bending of the destressed wafers.

However, these methods are not satisfactory because, with the exception of soldering, the temperature stability of the connection is too low and because in all methods the separation of the thin wafers from the carrier is technically very complicated and problematic because of the danger of breakage. An exception in this connection is only the use of adhesives which almost completely lose their adhesive power after having been exposed to ultraviolet light. However, at the present time, these adhesives are not heat resistant at temperatures above about 80° C.

SUMMARY OF THE INVENTION

Therefore, it is the primary object of the present invention to provide a method of the above-described type which avoids the problems discussed above.

In accordance with the present invention, the semiconductor substrate or wafer is applied onto a transportable electrostatic chuck and the semiconductor substrate or wafer remains on the electrostatic chuck for the duration of and between at least two processing steps.

Consequently, the present invention provides a method which avoids the problems described above by using a transportable chuck or substrate carrier; in this document, such substrate carriers are called transfer-ESC. The wafer is applied onto the transfer-ESC and remains on the transfer-ESC while the thickness of the wafer is reduced during some or all further processing steps, intermediate storage, for example, until the individual structural elements are separated or the structural elements or wafers are removed for packaging.

By using such a transfer-ESC, it is possible to manipulate and transport without problems even a very thin wafer having a thickness of less than 50 μm. In contrast to other methods, such as gluing, the wafer can also easily be fixed by building up an electrostatic holding force by electric charging and the wafer can be separated from the transfer-ESC by removing the electrostatic holding force by electric discharging.

Additional cleaning steps or similar treatments of the wafers for the removal of adhesives or foils are not necessary.

DETAILED DESCRIPTION OF THE INVENTION

A transportable electrostatic chuck suitable for the purpose of the invention must fully or partially meet the following requirements:

The holding force must be similarly high as in vacuum holders conventionally used for fixing wafers in polishing machines for reducing the thickness of wafers (up to about 0.1 N/mm$^2$). Therefore, the electrostatic chuck must have a holding force which is as high as possible because of the high shearing forces during the polishing process. For this reason, the use of unipolar electrostatic chucks is the method of choice, if other arguments make it not necessary to use bipolar electrostatic chucks, for example, because of the difficult charging and discharging.

The system must maintain its electrostatic charge as long as possible (for several hours) without continuous electric recharging, so that the thin wafer is not separated from the transfer-ESC during long or several process steps or operation steps.

In addition, the transfer-ESC must be resistant to water and acid (for example, during polishing and wet etching).

Also, the system must be extremely plane because otherwise the wafer would become uneven during polishing.

The transfer-ESC must also be heat resistant, ideally up to 450° C., for example, during dry or plasma etching or during the heat treatment of power semiconductors.

The transfer-ESC should also be as thin as possible, preferably thinner than 1 mm, and very light, so that it can be used without significant changes and without additional investments in existing machines and devices which are designed for thick wafers without transfer-ESC.

The transfer-ESC must also be well insulated, so that it can be operated in a partially wet surrounding. Consequently, it is necessary to protect the contacts (high voltage connections) against moisture. Accordingly, it is advantageous to carry out the electric charging or discharging of the transfer-ESC without contacts, for example, by inductive coupling into the high voltage. The transfer-ESC must then be provided with a rectifier circuit in order to produce the required direct voltage from the coupled alternating voltage. It is also advantageous if the transfer-ESC is inaccessible for longer periods of time, to integrate the complete electrical charging and discharging device in the transfer-ESC, and to provide the electrical supply by means of a battery or an accumulator. For this purpose, an inverse rectifier circuit and a cascade of voltage multipliers and a subsequent rectifier circuit must be integrated in the transfer-ESC.

If necessary, the essential functions of the transfer-ESC, such as electrostatic charging and electrostatic discharging, can also be remote controlled.

Because of the above-mentioned requirements, suitable materials of the dielectric of the transportable electrostatic chuck, in addition to plastic films, are preferably ceramic materials, for example, quartz, glass, aluminum oxide, titanium oxide, barium titanate.

The use of ceramic materials has the additional advantage that it is possible to realize high dielectricity constants at a small thickness of the dielectric. This makes it possible to increase the support force of the transfer-ESC by a multiple, as compared, for example, to plastic materials.

For manufacturing a very thin transfer-ESC, it is also possible to use manufacturing methods known from microelectronics or microstructural technologies (for example, lithography, plasma etching) and separating methods (PVD or CVD technologies) of dielectric materials on semiconductor materials, such as silicon.

For following or tracing the production sequence of the individual thin wafers which are very expensive, the transfer-ESC can also be provided with electronic labels. This makes it possible to produce a wafer which in the final analysis is the suitable transportable transfer-ESC.

It is advantageous to use a separate device, referred to as a transfer station, for placing the wafer on the transfer-ESC, for storing or charging the transfer-ESC connected to the wafer, for recharging the connected components and possibly for releasing the wafer from the transfer-ESC.

The basic component of the transfer station is a sample table, possibly constructed as an electrostatic carrier, on which the transfer-ESC is positioned. The wafer is then placed on the transfer-ESC and is fixed or secured by charging the transfer-ESC. When the wafer is very uneven, it may be necessary to reinforce the securing action by a mechanical load application. If the wafer should also be separated from the transfer-ESC on this sample table, the sample table must be equipped with sensors which indicate that the wafer in fact has been separated from the transfer-ESC.

The central sample table of the transfer station is operated by a robot which removes the wafer from the carrier and places the wafer on the transfer-ESC on the sample table. The same robot, or in an optimum embodiment a second robot, removes the transfer-ESC from a special tray and places the charged ESC in a tray or special carriers.

In accordance with one possibility, a robot of the transfer station transfers the wafer connected to the transfer-ESC directly to the processing machines.

To prevent a breakage of the wafer at the transfer station, each wafer transfer should be controlled and monitored by means of optical position sensors, for example, laser position sensors.

Accordingly, a complete electrostatic manipulating system for transporting and manipulating especially thin wafers is composed of several transfer-ESC and one or more transfer stations.

The method according to the present invention described above and the electrostatic chuck system and also the described transportable electrostatic transfer-ESC is preferably used for manipulating the wafer when the thickness of the wafer is reduced.

Additional fields of use of this method and of the manipulating system are in all those situations in which, for economical as well as technical reasons, it is advantageous to use transportable electrostatic chucks which are capable of maintaining the electrostatic power for a long period of time without continuously requiring a stationary electric recharging. For example, the physical/chemical analysis of the wafers must be mentioned.

Such a system can be used for transporting wafers into and out of an electronic microscope (SEM) for the wafer analysis.

The electrostatic manipulating method with a transfer-ESC, particularly for thin wafers, will be explained in connection with the following example having the steps 1 through 7.

1. The previously structured thick wafers having a thickness of about 200-750 µm are delivered in carriers or wafer boxes for reducing the thickness.

2. A robot removes the thick wafer from the carrier and places it on the transfer-ESC.

3. The transfer-ESC is electrically charged and thereby fixes or secures the wafer whose thickness is to be reduced; subsequently, the transfer-ESC is placed with the fixed wafer either in wafer carriers or is directly transported for reducing the thickness to further processing machines, for example, polishing or etching machines.

4. In certain intervals, typically 4-8 hours, during, after or prior to processing, the transfer-ESC with the fixed wafer is recharged in or outside of the processing machine, for example, by using another transfer station of the type described above.

5. Subsequently, the recharged transfer-ESC are moved with the fixed wafer, for example, to the next processing machine, or are placed in carriers.

6. The steps 4 and 5 can be repeated several times depending on the duration of the process sequences and the number of processing steps.

7. After the respective processing step, for example, reducing thickness, sawing, sorting, or if necessary during the processing steps, the transfer-ESC is electrically discharged and releases the thin wafer or the already separated structural elements for further processing or, for example, for packing.

While specific embodiments of the invention have been described in detail to illustrate the inventive principles, it will be understood that the invention may be embodied otherwise without departing from such principles.

We claim:

1. A method of manipulating semiconductor substrates comprising placing a semiconductor substrate on a transportable electrostatic chuck, and keeping the semiconductor substrate clamped on the electrostatic chuck for the duration of and between at least two processing steps of the semiconductor substrate without any additional external power supply to recharge the transportable electrostatic chuck during long or several process steps or operation steps.

2. The method according to claim 1, wherein the transportable electrostatic chuck has a thickness of 0.3- 2.5 mm, comprising using the electrostatic chuck and the wafer placed thereon in unmodified or little-modified machines for processing semiconductor substrates.

3. The method according to claim 1, wherein the transportable electrostatic chuck is a component of an electrostatic chuck system, further comprising inductively charging and discharging without contact the electrostatic chuck system.

4. The method according to claim 1, wherein the transportable electrostatic chuck includes an integrated electrical charging and/or discharging device, comprising supplying the charging and/or discharging device by a battery or an accumulator.

5. The method according to claim 4, comprising controlling the transportable electrostatic chuck for electrostatically charging and/or electrostatically discharging by remote control.

6. The method according to claim 1, comprising electrically charging and/or discharging the transportable electrostatic chuck separately in one or more mobile or stationary transfer stations.

7. The method according to claim 6, comprising recharging or discharging the electrostatic chuck in a charging station of a processing machine.

8. The method according to claim 1, comprising monitoring and/or controlling the steps of securing and/or separating the wafer from the electrostatic chuck by means of position sensors.

9. The method according to claim 1, wherein the transportable electrostatic chuck is used in a unipolar or bipolar electrostatic system.

10. The method according to claim 1, comprising labeling the electrostatic chuck with an electronic label for facilitating sorting and following a production sequence of individual semiconductor substrates.

11. An electrostatic carrier system for manipulating semiconductor substrates, the system comprising at least one transportable electrostatic chuck for a semiconductor substrate and at least one transfer station for transferring the transportable electrostatic chuck with the semiconductor substrate placed thereon between processing steps, the electrostatic chuck being configured so as to clamp the substrate without any additional external power supply to recharge the transportable electrostatic chuck during long or several process or operation steps.

12. The system according to claim 11, comprising an integrated electrically charging and/or discharging device for the transportable electrostatic chuck, and a battery or an accumulator for supplying the electrical charging and/or discharging device.

13. The system according to claim 12, comprising a remote control for the charging and/or discharging device.

14. The system according to claim 11, comprising position sensors for monitoring and/or controlling the position of the semiconductor substrate.

15. The system according to claim 11, wherein the system is a unipolar or bipolar electrostatic system.

16. The system according to claim 11, wherein the electrostatic chuck has an electronic label.

* * * * *